(12) United States Patent
Bai et al.

(10) Patent No.: US 12,132,378 B2
(45) Date of Patent: Oct. 29, 2024

(54) COIL SUPPORT STRUCTURE FOR SUPERCONDUCTING COILS IN A SUPERCONDUCTING MACHINE

(71) Applicant: General Electric Company, Schenectady, NY (US)

(72) Inventors: Ye Bai, Schenectady, NY (US); Alexander Kagan, Guilderland, NY (US); Anbo Wu, Clifton Park, NY (US); Minfeng Xu, Ballston Lake, NY (US); Dalong Li, Carmel, IN (US)

(73) Assignee: General Electric Renovables Espana, S.L., Barcelona (ES)

( * ) Notice: Subject to any disclaimer, the term of this patent is extended or adjusted under 35 U.S.C. 154(b) by 106 days.

(21) Appl. No.: 17/858,334

(22) Filed: Jul. 6, 2022

(65) Prior Publication Data
US 2024/0014725 A1   Jan. 11, 2024

(51) Int. Cl.
| | |
|---|---|
| H02K 55/00 | (2006.01) |
| G01R 33/34 | (2006.01) |
| H01F 6/06 | (2006.01) |
| H02K 7/18 | (2006.01) |

(52) U.S. Cl.
CPC ............ *H02K 55/00* (2013.01); *G01R 33/34* (2013.01); *H01F 6/06* (2013.01); *H02K 7/183* (2013.01)

(58) Field of Classification Search
CPC ........ H02K 55/00; H02K 7/183; G01R 33/34; H01F 6/06; H01F 6/02; Y02E 40/60
See application file for complete search history.

(56) References Cited

U.S. PATENT DOCUMENTS

| | | | |
|---|---|---|---|
| 5,708,405 A * | 1/1998 | Moriyama | H01F 41/048 505/879 |
| 7,098,663 B1 * | 8/2006 | Hollis | G01R 33/3815 335/216 |
| 9,508,477 B2 | 11/2016 | Wu et al. | |
| 2016/0038321 A1 * | 2/2016 | Shumer | A61M 25/0122 606/108 |
| 2016/0298354 A1 * | 10/2016 | Gauché | F16M 11/24 |
| 2016/0351311 A1 * | 12/2016 | Ando | G01R 33/288 |
| 2018/0286572 A1 | 10/2018 | Noys | |

FOREIGN PATENT DOCUMENTS

| | | |
|---|---|---|
| GB | 2471326 A | 12/2010 |
| JP | H0529137 A | 2/1993 |
| WO | WO2016/060957 A2 | 4/2016 |
| WO | WO2021/151600 A1 | 8/2021 |
| WO | WO2021/156917 A1 | 8/2021 |

OTHER PUBLICATIONS

Dixon et al., Mechanical Properties of Epoxy Impregnated Superconducting Solenoids, IEEE Transactions on Magnetics, vol. 32, No. 4, Jul. 1996, pp. 2917-2920. https://ieeexplore.ieee.org/document/511486.
European Search Report EP 23183651 on Apr. 5, 2024.

* cited by examiner

*Primary Examiner* — Christopher P McAndrew
*Assistant Examiner* — Zannatul Ferdous
(74) *Attorney, Agent, or Firm* — Dority & Manning, P.A.

(57) ABSTRACT

A superconducting machine includes at least one superconducting coil and a coil support structure arranged with the at least one superconducting coil. The coil support structure includes at least one composite component affixed to the at least one superconducting coil and an interface component in frictional contact with the at least one composite component so as to reduce a likelihood of quench of the at least one superconducting coil.

20 Claims, 7 Drawing Sheets

COIL SUPPORT STRUCTURE FOR SUPERCONDUCTING COILS IN A SUPERCONDUCTING MACHINE

STATEMENT REGARDING FEDERALLY SPONSORED RESEARCH OR DEVELOPMENT

This invention was made with Government support under Contract No. 1U01EB026976 awarded by the National Institutes of Health (NIH). The Government has certain rights in the invention.

FIELD

The present disclosure relates generally to superconducting machines, and more particularly to coil support structures for superconducting coils in superconducting machines to reduce the stress/strain.

BACKGROUND

Generally, superconducting rotating machines, such as superconducting generators and motors (collectively referred to herein as electric machines) typically include a plurality of superconducting coils for generating at least one of a static or rotating magnetic field. Superconducting rotating machines are made by constructing field coils (which typically carry a direct current) of a superconducting material ("superconductor") instead of the normally-conducting material with an electrical resistance (e.g., copper, aluminum, etc.). The current-carrying capacity of superconducting materials in their superconducting state is typically over an order of magnitude higher than that of traditional conductors such aluminum or copper at room temperature, particularly in DC operation or low frequency. Thus, the use of superconductors can have a wide range of uses in power applications.

For example, magnetic resonance imaging (MRI) is a medical imaging technique used in radiology to form images of the anatomy and/or the physiological processes of the body without requiring an invasive procedure. More particularly, MRI machines rely on various physical principles (such as the principle of magnetism, the phenomenon of an area of protons aligning with a magnetic field with sufficient strength, and the phenomenon of select protons within the area of protons being pushed out of alignment with the magnetic field when a radiofrequency current is introduced) to acquire data and to construct images or otherwise represent the observed internal features of the body.

Further, MRI machines are based on the interactions among a primary magnetic field, a radiofrequency (RF) magnetic field, and time varying magnetic gradient fields with gyromagnetic material within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

During imaging sequences, time varying gradient fields and RF fields are generated by the application of current to a series of gradient coils and RF coils, respectively. Additionally, the primary magnetic field is generated by a permanent magnet or the application of current to a set of primary coils. The primary magnetic field is generally uniform and of significant strength (e.g., 0.5 Tesla (T), 1 T, 2 T, and so on). Superconducting coils may be used to produce high strength magnetic fields such as 1.5 T, 3 T, 7 T, or greater.

In another example, superconducting generators, such as those used in wind turbines, take advantage of alternating magnetic polarities established by the superconducting field coils. That is, north poles are located between south poles to create a regular north, south, north, south, etc. field pattern. These alternating polarities are generated by relying on superconducting field windings made of superconductors, which conduct current in opposing directions. The magnetic fields generated by the field coils interact with the magnetic poles of the armature coil(s) to create torque. Torque is produced by the interaction of two magnetic fields trying to align. The magnitude of the torque is tied to the strength of the magnetic fields and radius at which they interact. For steady motion, the two magnetic fields must move at the same speed. This is accomplished by making one magnetic field travel in space using windings that carry alternating currents. In the superconducting machines described herein, the field windings carry DC current. The armature windings carry alternating currents, the frequency of which is set by the relative motion of the stationary and rotating members. The magnetic field produced by the field coils improves the torque density of the machine, owing to the much higher current-carrying capability of superconducting wires.

Regardless of the application, superconducting magnets usually experience significantly large forces during the cool-down and energizing phases. In addition, the superconducting magnets may expand and contract during the cool-down and energizing phases. In cryogenic temperatures, the specific heat of the superconducting conducting coil and coil support structure is very small. Therefore, some types of microcracking or micro stick-slip may occur inside of the superconducting coils and/or on the coil support structure. Further, the expansion and contraction of the superconducting magnets can lead to small movements, which can cause frictional forces that generate heat in the superconducting magnets. These microcracks or micro-stick-slips or frictional forces then release adequate energy to heat up superconducting coils immediately and either cause the entire coil to quench (i.e. exit a superconducting state) or to increase in resistive properties.

Thus, the industry is continuously seeking new and improved superconducting machines that address the aforementioned issues. Accordingly, the present disclosure is directed to an interface component for high-field superconducting coils in a superconducting machine.

BRIEF DESCRIPTION

Aspects and advantages of the disclosure will be set forth in part in the following description, or may be obvious from the description, or may be learned through practice of the disclosure.

In one aspect, the present disclosure is directed to a superconducting machine. The superconducting machine includes at least one superconducting coil and a coil support structure arranged with the at least one superconducting coil. The coil support structure includes at least one composite component affixed to the at least one superconducting coil and an interface component in frictional contact with the at least one composite component so as to reduce a likelihood of quench of the at least one superconducting coil.

In further embodiments, the at least one superconducting coil and the coil support structure are supported by a support frame, the support frame defining a base and at least one support plate for supporting the at least one superconducting coil and the coil support structure.

In additional embodiments, the support frame includes one or more grooves formed therein for relieving stress.

In particular embodiments, the at least one composite component includes, at least, a first composite component and second composite component, the first composite component being affixed between a first side of the at least one superconducting coil and the interface component atop the support plate, the second composite component being affixed between a second side of the at least one superconducting coil and the base.

In other embodiments, the at least one superconducting coil and the coil support structure are separated from an interior portion of the support frame by a gap.

In further embodiments, the first composite component and the second composite component are constructed of an adhesive material.

In additional embodiments, the interface component is constructed of a high-pressure fiberglass laminate.

In particular embodiments, the at least one superconducting coil includes at least one rib on an outer surface thereof for reducing temperature rise from the frictional contact between the interface component and the at least one composite component.

In other embodiments, the superconducting machine is a wind turbine generator.

In another aspect, the present disclosure is directed to a superconducting machine. The superconducting machine includes a plurality of superconducting coils. The plurality of superconducting coils includes at least a first superconducting coil and a second superconducting coil. The superconducting machine further includes a coil support structure arranged between the first and second superconducting coils. The coil support structure includes at least one composite component affixed to one of the first superconducting coil or the second superconducting coil and a sliding interface component arranged adjacent to the at least one composite component so as to reduce a likelihood of quench of the plurality of superconducting coils.

These and other features, aspects and advantages of the present disclosure will become better understood with reference to the following description and appended claims. The accompanying drawings, which are incorporated in and constitute a part of this specification, illustrate embodiments of the disclosure and, together with the description, serve to explain the principles of the disclosure.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Figure 1:
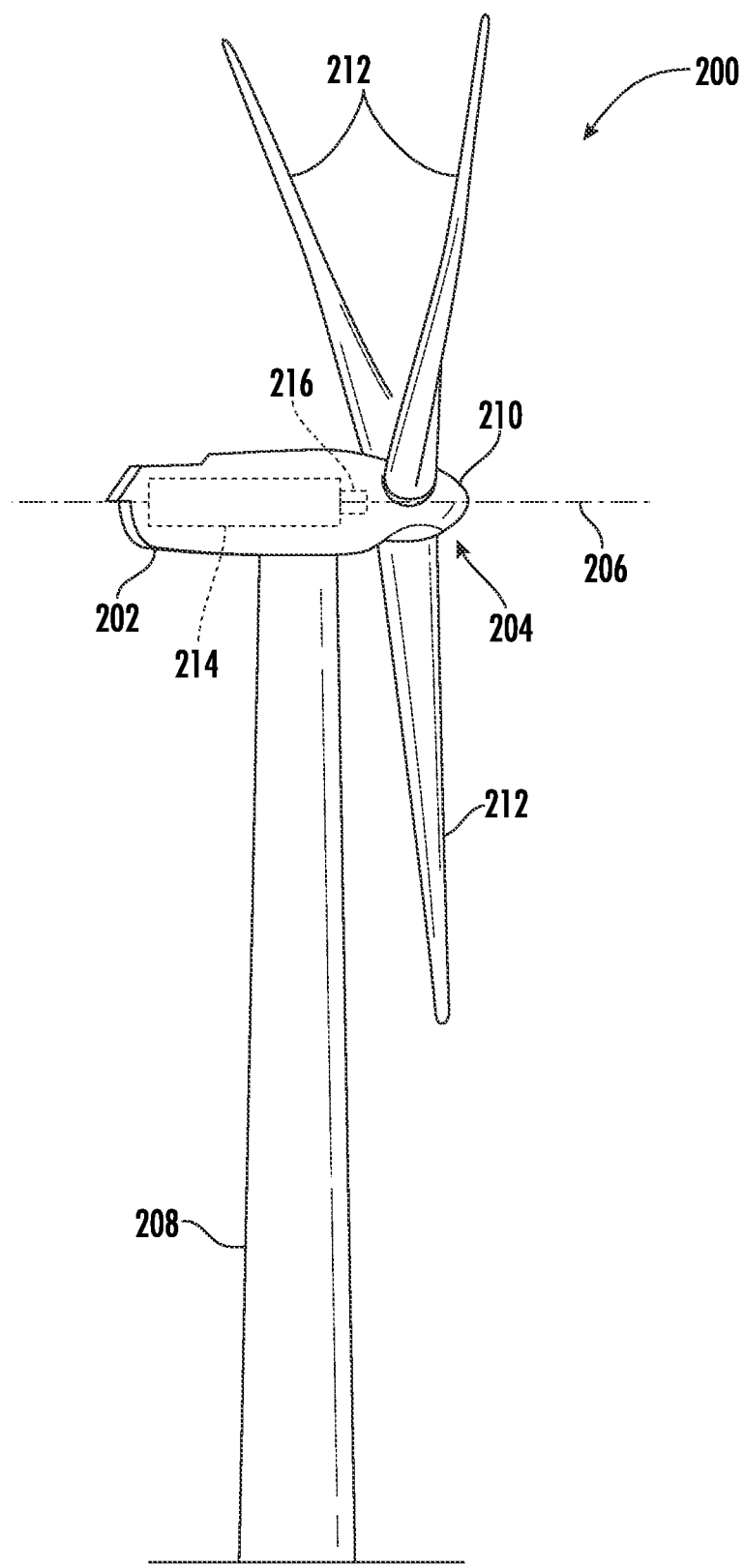
FIG. 1 illustrates a side, perspective view of an embodiment of a wind turbine having a superconducting generator according to the present disclosure.

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part of one embodiment can be used with another embodiment to yield a still further embodiment. Thus, it is intended that the present disclosure covers such modifications and variations as come within the scope of the appended claims and their equivalents.

As used herein, the terms "first", "second", and "third" may be used interchangeably to distinguish one component from another and are not intended to signify location or importance of the individual components.

The terms "coupled," "fixed," "attached to," and the like refer to both direct coupling, fixing, or attaching, as well as indirect coupling, fixing, or attaching through one or more intermediate components or features, unless otherwise specified herein.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

In general, the present disclosure is directed to a superconducting machine, such as a magnetic resonance imaging (MRI) machine or a superconducting generator. The present disclosure is described herein with reference to a superconducting machine in general, and more particularly to either an MRI machine or a wind turbine superconducting generator, but is not limited to such examples. For example, the present disclosure is directed to a superconducting machine, such as an MRI machine, that includes a first superconducting coil and a second superconducting coil and a coil support structure arranged between the first and second superconducting coils. The coil support structure could include a composite component or a sliding interface component. In addition, the present disclosure is directed to a superconducting machine, such as a superconducting generator of a wind turbine, that includes a superconducting coil and a coil support structure arranged with the superconducting coil. The coil support structure may include a composite component affixed to the superconducting coil and an interface component in frictional contact with the composite component.

By utilizing a composite component and an interface component and superconducting coils in such a manner, a gap between the superconducting coil and a support frame may be created so as to reduce the likelihood of quench of the superconducting coil. In addition, the composite component and interface component may be capable of controlling the movement of the superconducting coil by reducing frictional energy generated at the interface component, such as with an MRI machine. Further, the composite component and interface component may be capable of controlling the movement of the superconducting coil by providing a frictional contact that forestalls movement, such as with a superconducting generator in a wind turbine.

Thus, superconducting machines of the present disclosure are configured to reduce stress and frictional energy release between superconducting coils and the surfaces and/or components of the superconducting machines, thereby reducing a cause of training quenches in superconducting machines. Accordingly, in reducing stress and frictional energy release between the superconducting coils and the surfaces and/or components of the superconducting machines, the risk of the superconducting coils overheating and quenching may be reduced. Thus, the overall maintenance related to quench recovery and system downtime may be reduced. These configurations and advantages can be at least found when applying the general principles discussed above in relation to an MRI machine or a wind turbine superconducting generator as discussed below.

Referring now to the drawings, FIG. 1 illustrates a side, perspective view of an embodiment of another superconducting machine, such as a wind turbine, having a superconducting generator according to the present disclosure. As shown, the wind turbine 200 generally includes a tower 208 extending from a support surface, a nacelle 202 mounted on the tower 208, and a rotor 204 coupled to the nacelle 202. The rotor 204 includes a rotatable hub 210 and at least one rotor blade 212 (three are shown) coupled to and extending outwardly from the hub 210. Each rotor blade 212 may be spaced about the hub 210 to facilitate rotating the rotor 204 about an axis of rotation 206 to enable kinetic energy to be transferred from the wind into usable mechanical energy, and subsequently, electrical energy. For this purpose, the rotor 204 is coupled to a generator 214 via a rotor shaft 216. For purposes of the present disclosure, the generator 214 is a direct drive superconducting generator.

Figure 2:
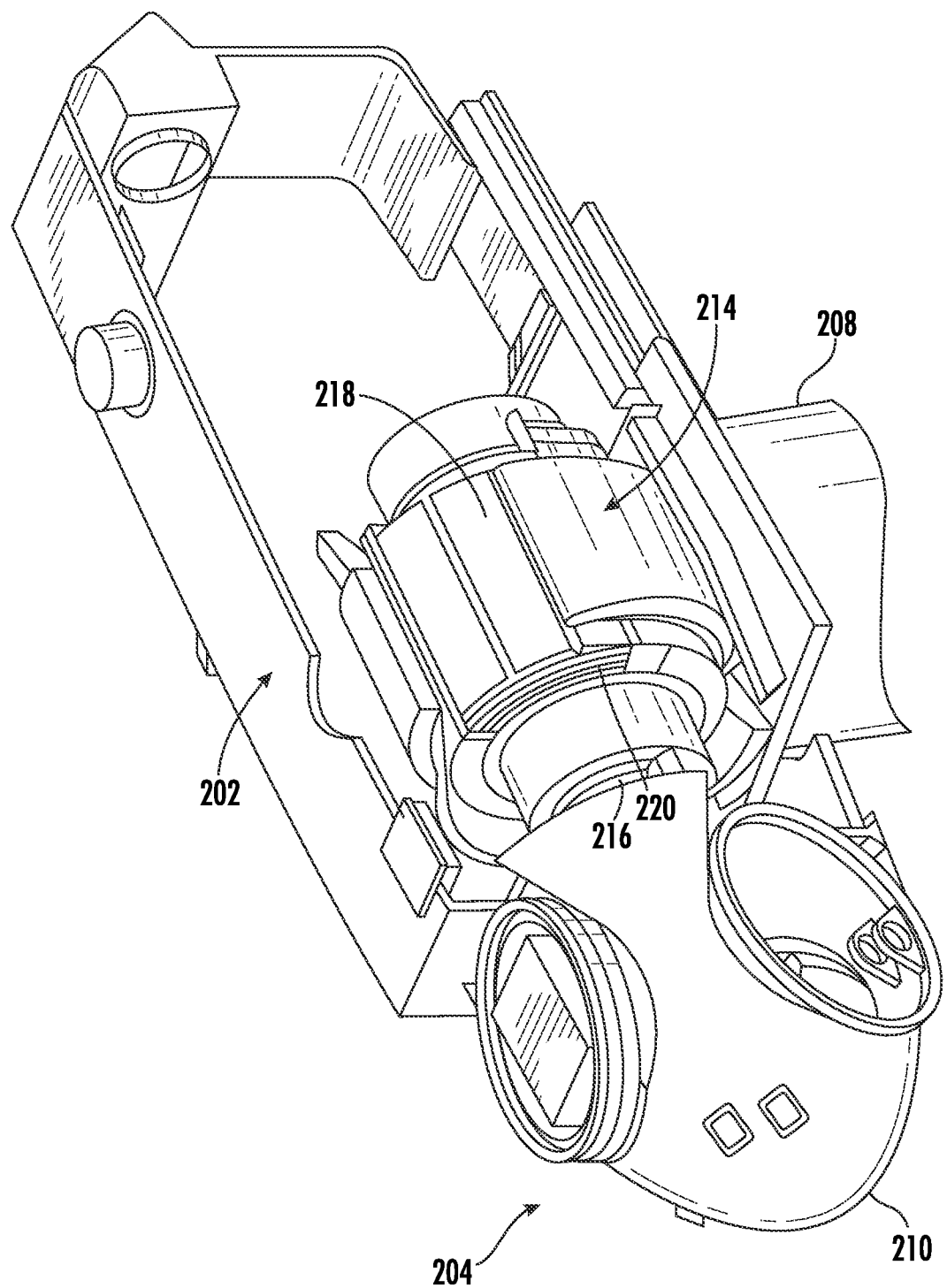
FIG. 2 illustrates an internal, perspective view of an embodiment of a nacelle of the wind turbine of FIG. 1, particularly illustrating another embodiment of a superconducting machine, in particular, a superconducting generator housed in the nacelle according to the present disclosure.

Referring now to FIG. 2, a simplified, internal view of an embodiment of the nacelle 202 of the wind turbine 200 shown in FIG. 1 is illustrated according to the present disclosure. As shown, the generator 214 is housed within the nacelle 202 and includes a field assembly 220 and an armature 218. Moreover, as shown, the generator 214 is generally coupled to the rotor 204 for producing electrical power from the rotational energy generated by the rotor 204. For example, as shown in the illustrated embodiment, the rotor 204 may include a rotor shaft 216 coupled to the hub 210 for rotation therewith. The rotor shaft 216 may, in turn, be rotatably coupled to a armature 218 of the generator 214. As is generally understood, the rotor shaft 216 may provide a torque input to the armature 218 of the generator 214 in response to rotation of the rotor blades 212 and the hub 210.

In an embodiment, electrical power may then be generated using the commonly known principles of induction by applying a torque input to the armature 218 of the generator 214. The armature 218 may then spin within a magnetic field provided by the field assembly 220 of the generator 214 (e.g., in an internal rotor configuration).

Figure 3:
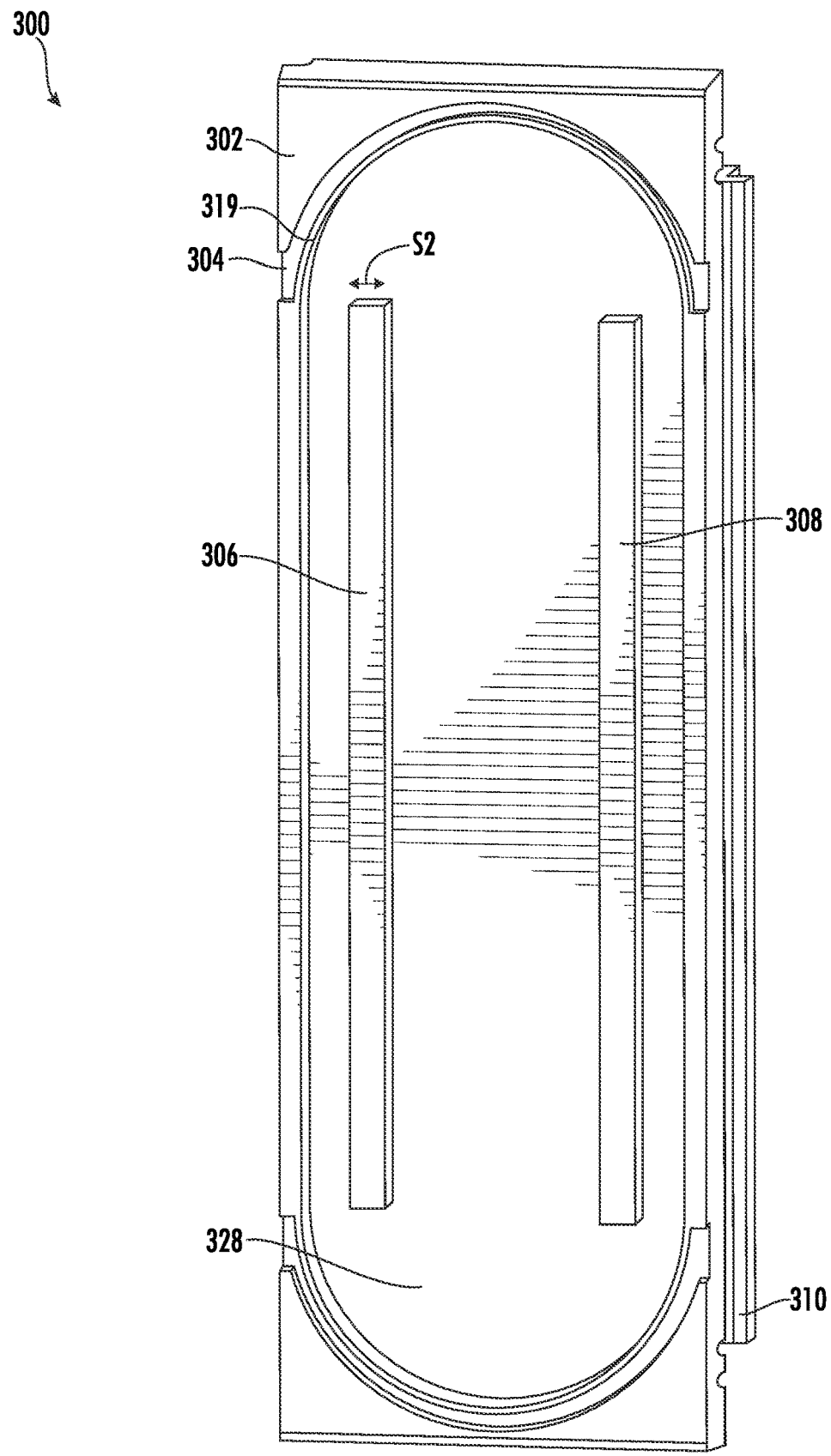
FIG. 3 illustrates a perspective view of an embodiment of a coil structure of the superconducting generator of FIG. 2 having a superconducting coil and support frame according to the present disclosure.

Referring now to FIG. 3, a perspective view of an embodiment of a coil structure 300 for a superconducting machine, such as the wind turbine 10, is illustrated according to the present disclosure. As shown, the coil structure 300 includes a support frame 302 and a superconducting coil 304. In certain embodiments, the support frame 302 is provided to house and support the superconducting coils 304. The support frame 302 may also have an attachment portion 310. The attachment portion 310 may enable the support frame 302 to be attached to the generator 214 or another support frame if desired.

In addition, the support frame 302 may be constructed of a variety of materials. For example, in certain embodiments, the support frame 302 may be formed from a fiber, a polymer, a fiber-reinforced polymer, or a metal such as an aluminum. Such materials can be beneficial in dissipating heat which may otherwise lead to quenching and/or an increase in resistance of the superconducting coils. This dissipation of heat may be further assisted by the inclusion of one or more ribs (such as a first rib 306 and a second rib 308) disposed on an outer surface of the support frame 302. By providing multiple pathways for heat dissipation, temperature rise of the superconducting coil(s) 304 may be reduced.

Figure 4:
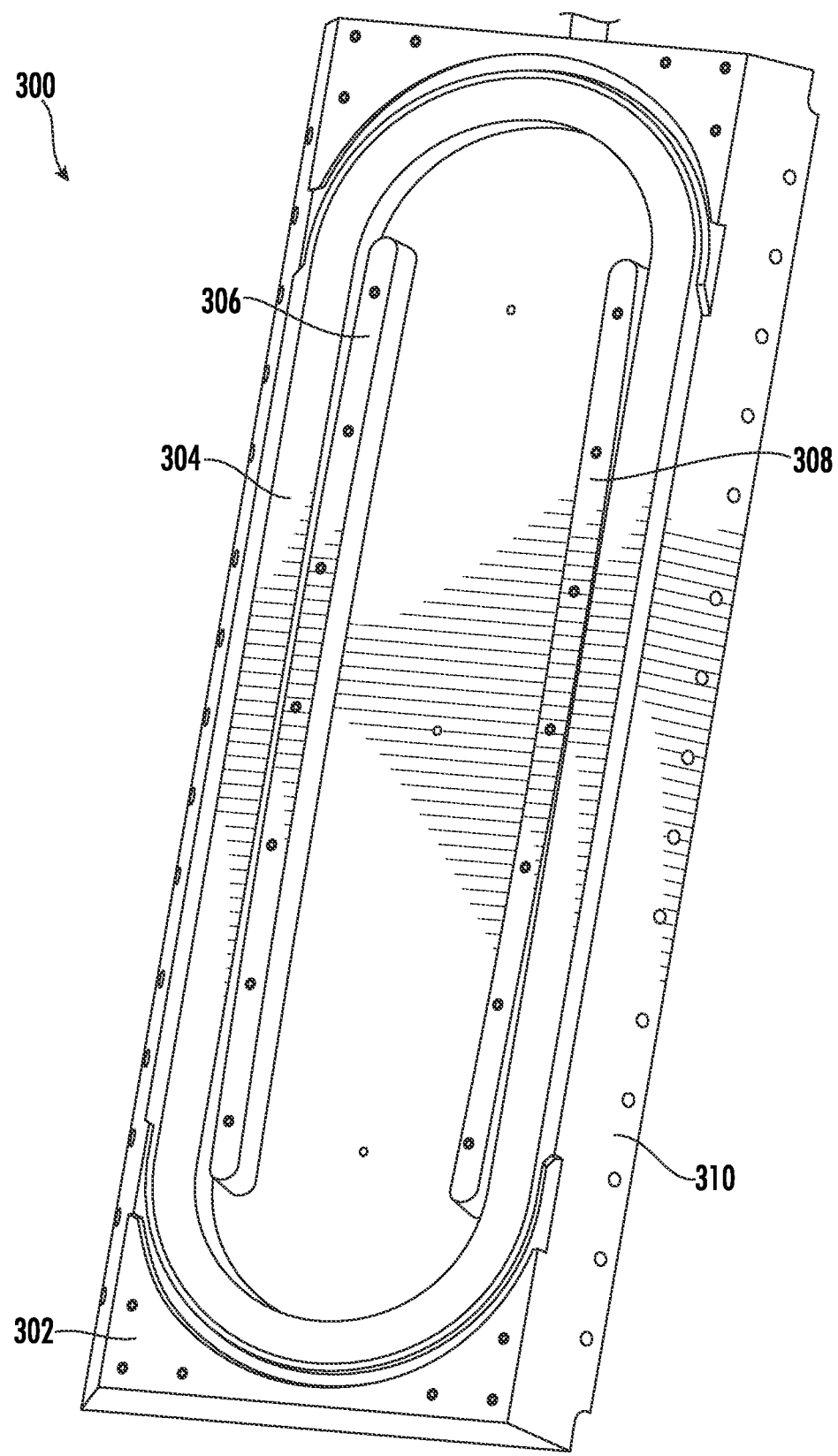
FIG. 4 illustrates a cross-sectional view of an embodiment of a coil structure of according to the present disclosure.
Figure 7:
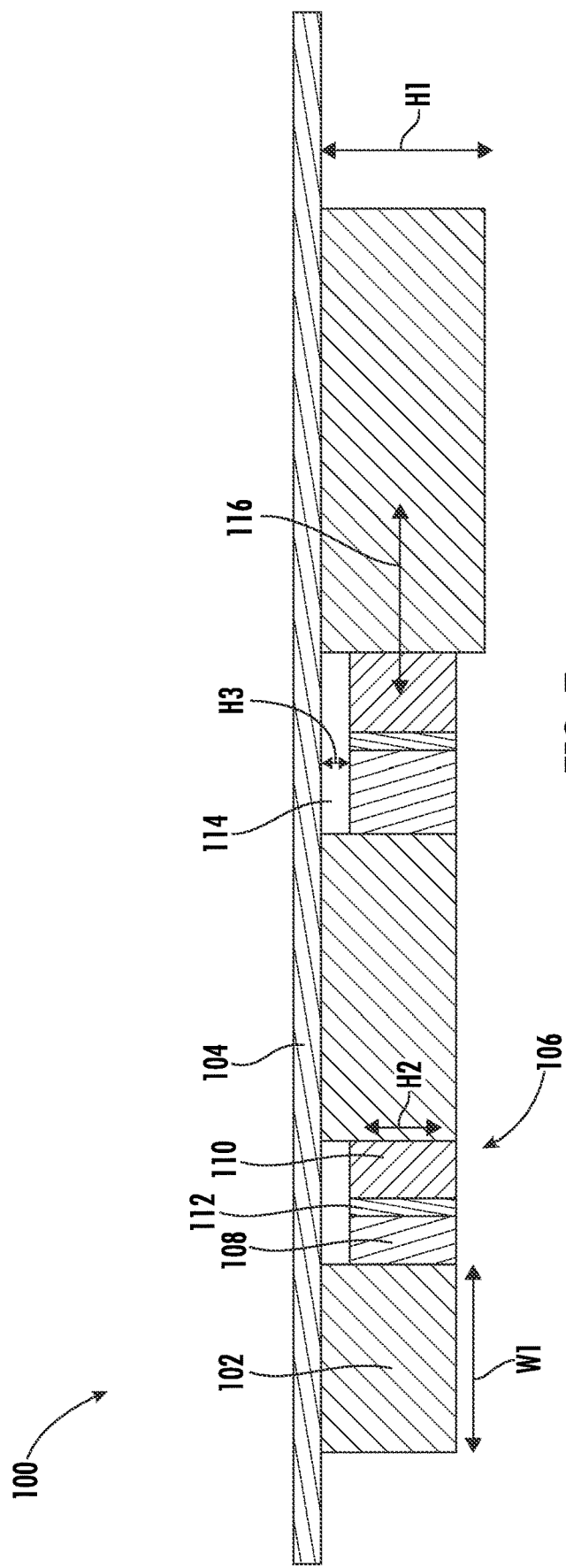
FIG. 7 illustrates a cross-sectional view of an embodiment of an MRI magnet structure of the MRI machine of FIG. 6 according to the present disclosure.

Referring now to FIG. 4, a cross-sectional view of an embodiment of the coil structure of FIG. 3 is illustrated. As stated previously, the support frame 302 may house the superconducting coil 304. Similar to the superconducting coil 102 of the MRI machine as shown in FIG. 7, the superconducting coil 304 of the superconducting generator may have similar superconducting properties as described herein.

Furthermore, in an embodiment, the superconducting coil(s) 304 may carry excitation current, wherein current flowing therethrough produces a magnetic field (e.g., a first common polarity), and the armature coil is connected to the output of the generator 214 (e.g., via output terminals) to conduct an output current and electrical power output. Although only one coil is depicted, several coils may be placed about the armature 218 and field assembly 220 in various embodiments, e.g., to configure the number of poles of the generator 214 and, thereby, the generating frequency and/or other operating characteristics of the generator 214. The polarity of this magnetic field produced may be configured by setting the flow of the electrical current in a direction. The polarity of the magnetic field may then be switched to an opposing polarity by reversing the flow of the electrical current in an opposite direction. For example, in an embodiment, the polarity of one set of coils may be set to north as a result of the flow of the electrical current. In another embodiment, the polarity of a second set of coils may be set to south as a result of the flow of the electrical current.

Figure 5:
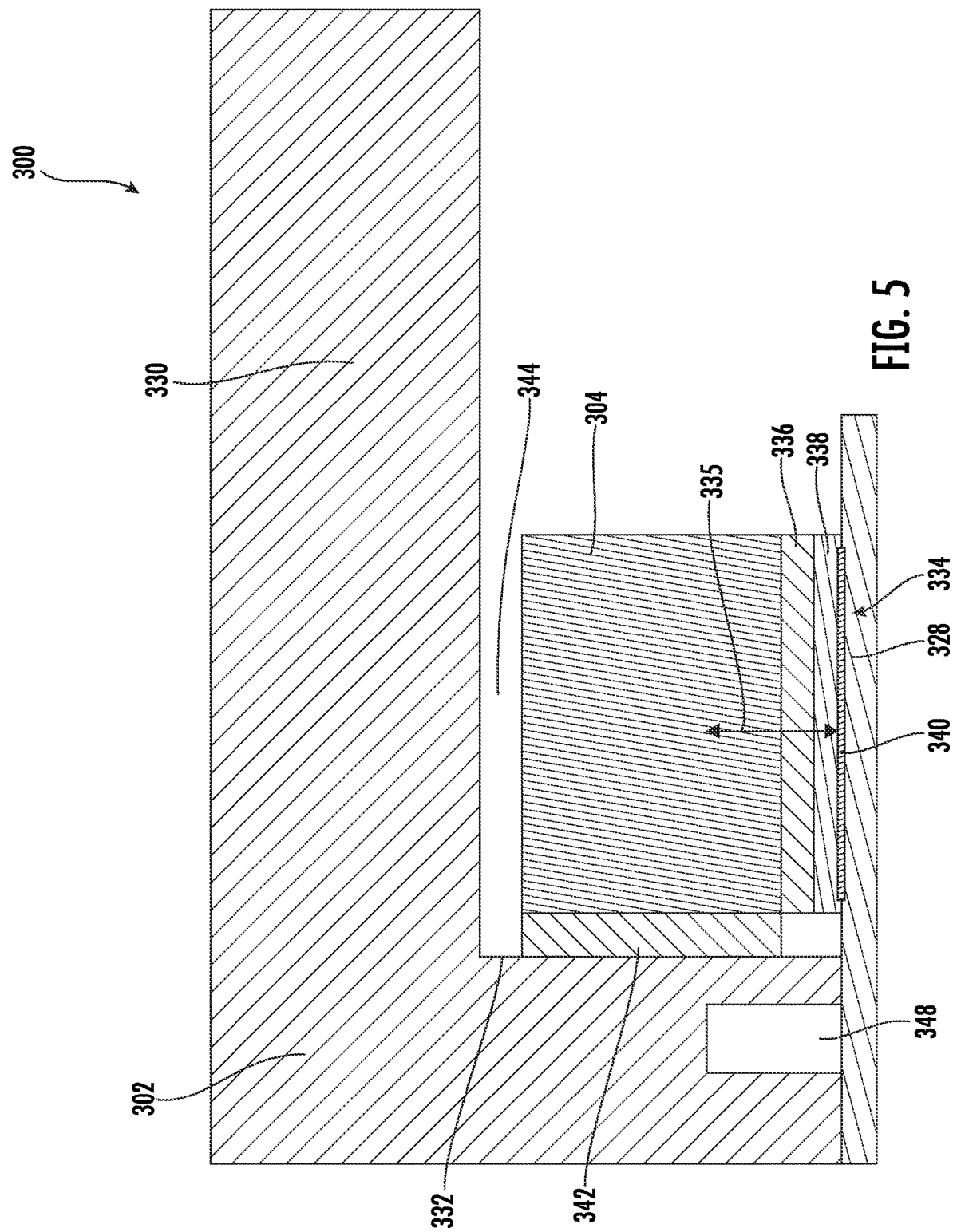
FIG. 5 illustrates a detailed, cross-sectional view of an embodiment of the coil structure of FIGS. 3-4 according to the present disclosure.

Referring now to FIG. 5, a detailed, cross-sectional view of an embodiment of the coil structure 300 of FIGS. 3-4 and a cross-sectional view of an embodiment of a coil support structure of a superconducting generator are illustrated, respectively. As shown, the coil structure 300 generally includes a support frame 302, a superconducting coil 304, and a coil support structure 334 including a first composite component 336, an interface component 338, a frictional contact 340, and a second composite component 342.

The support frame 302 may be formed from both a base 330 and a separate support plate 328 attached to the base 330. The support plate 328 may be attached to the base 330 using any number of means. For example, the support plate 328 may be attached to the base 330 using bolts, screws, rivets, welds, or combinations thereof. By attaching the support plate 328 as a separate piece to the base 330, the base 330 may be covered by the support plate 328. In addition, by attaching the support plate 328 as a separate piece, the superconducting coil 304, the first composite component 336, the interface component 338, the frictional contact 340, and the second composite component 342 may be placed either within the base 330 or on the support plate 328 prior to attaching the support plate 328 to the base 330. In doing this, the overall coil structure 300 may be more easily assembled.

As stated above, the coil support structure 334 may include the first composite component 336, the interface component 338, the frictional contact 340, and the second composite component 342. The first composite component 336 may be constructed of at least one of an epoxy or a resin.

The interface component 338 may be constructed of at least one of a fiber, a polymer, a glass, an epoxy, or combinations of multilayer materials of single materials thereof.

The frictional contact 340 may result from placing the interface component 338 between the composite component 336 and the support frame 302 or more specifically, the support plate 328 of the support frame 302. Alternatively, the frictional contact may be a separate material placed between the interface component 338 and the support frame 302.

The first composite component 336 may be attached to the superconducting coil 304. For example, the first composite component 336 may be secured between the superconducting coil 304 and the interface component 338. Further, as shown, the interface component 338 may be secured to the first composite component 336. When the frictional contact 340 is a separate material, the frictional contact 340 may be secured to the interface component 338. To minimize the frictional energy release at the frictional contact and reduce the potential risk of the superconducting coil 304 quenching, the coefficient of friction of the frictional contact 340 needs to be minimized. To this end, materials such as a polymer material like Teflon and Mylar can be applied as the frictional contact 340. Furthermore, multiple layers of the frictional contact 340 can be applied to further reduce the coefficient of friction.

The first composite component 336, the interface component 338, and the frictional contact 340 (when provided) of the coil support structure 334 may be arranged in a stacked configuration in a lateral direction 335 in relation to each other. However, it should be understood that a stacked configuration or a lateral direction 335 is not the only way the first composite component 336, the interface component 338, and the frictional contact 340 may be arranged.

Still referring to FIG. 5, the support frame 302 may include a base 330 and a separate support plate 328 attached to the base 330. The base 330 of the support frame 302 may also include a ceiling 330 and a wall 332. When the support frame 302 includes the support plate 328, ceiling 330, and the wall 332, the interface component 338 or the frictional contact 340 (when provided) may be attached to the support plate 328, as stated above. In addition, a second composite component 342 may be attached to both a surface of the wall 332 and the superconducting coil 304. For example, the second composite component 342 may be affixed between a second side of the at least one superconducting coil 304 and the wall 332 of the support frame 302. Like the first composite component 336, the second composite component 342 may be composed of at least one of an adhesive material such as an epoxy or a resin. By attaching the superconducting coil 304 to the second composite component 342 which is then attached to a surface of the wall 332, a bond may be formed between the superconducting coil 304 and the surface of the wall 332 which is capable of preventing the superconducting coil 304 from moving toward the ceiling 330 of the support frame 302 and generating heat via frictional forces. The bond may also be capable of preventing the superconducting coil from moving in relation to the wall 332 such that friction is generated.

In addition, the coil structure 300 includes a gap 344 between the superconducting coil 304 and the ceiling 330. In such embodiments, the gap 344 assists with preventing the superconducting coil(s) 304 from contacting the support frame 302 and generating heat via frictional forces which may then lead to quenching of the superconducting coils 304.

The support frame 302 may further include one or more stress relieving grooves 348. In such embodiments, the stress relieving groove 348 helps to disperse stress between the superconducting coil(s) 304 and support frame 302. Further, the stress relieving groove 348 may be capable of dispersing the stress between the superconducting coil 304 and support frame 302, while also not significantly impacting the aforementioned heat dispersing properties of the support frame 302. In addition, in an embodiment, the stress relieving groove 348 may be provided on the curved portions of the inner perimeter 319 of the support frame 302 (as shown on FIG. 3). By providing the stress relieving groove 348 on the curved portions of the inner perimeter 319, the largest stresses which occur at the curved portions as a result of the superconducting coil 304 expanding and contracting may be dispersed while minimally impacting the heat dispersion properties of the support frame 302. However, it should be understood that the location and geometry of the stress relief grooves 348 can be different based on the overall shape of the support frame 302, the superconducting coils 304, or any other component of the coil structure 300 when needed. For example, if the superconducting coils 304 had a substantially rectangular shape, the stress-relieving grooves 348 could be placed along the corners of the superconducting coils 304.

Figure 6:
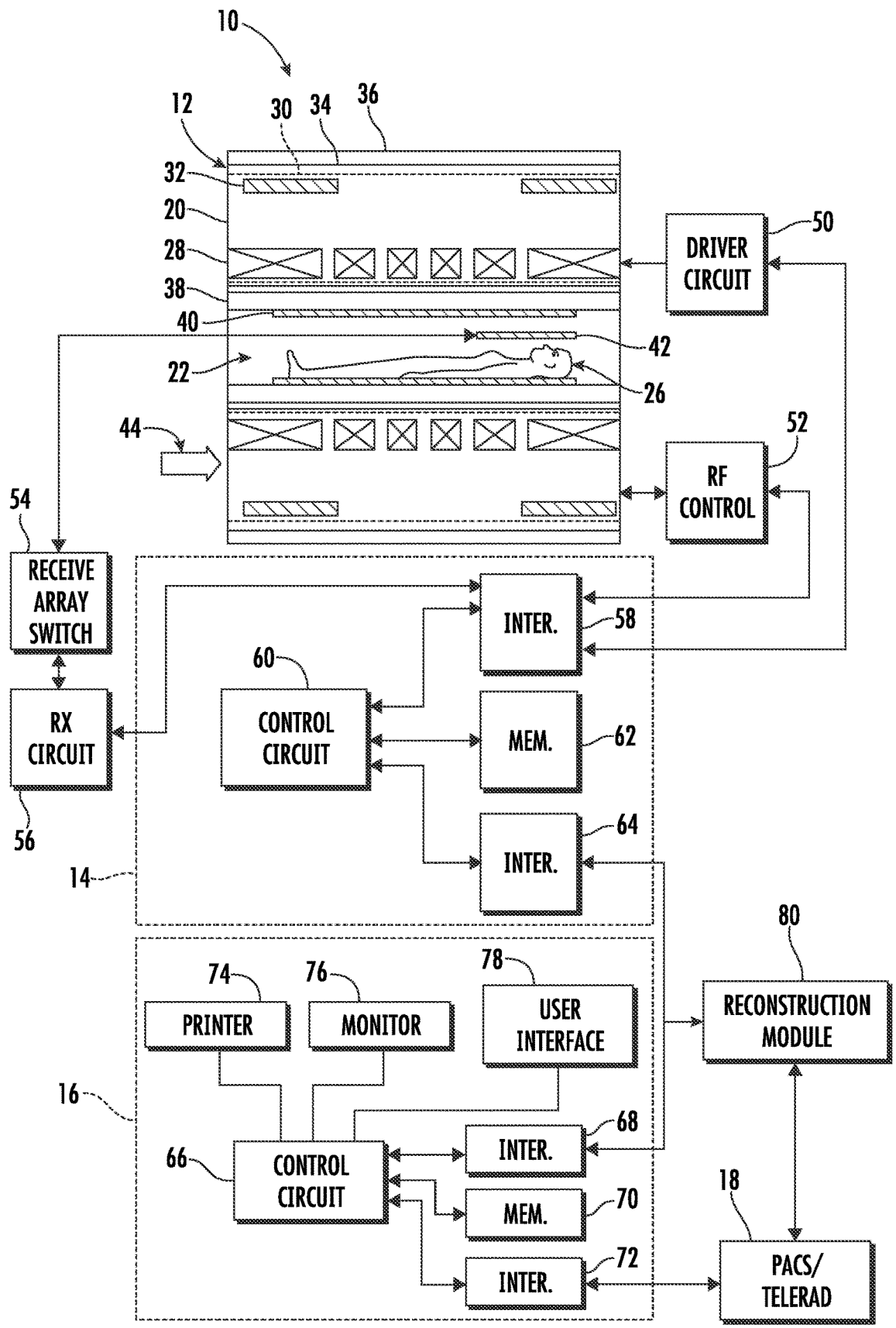
FIG. 6 illustrates a side, schematic view of an embodiment of a superconducting machine, in particular, a magnetic resonance imaging (MRI) machine, particularly illustrating an MRI magnet structure, a scanner, and an image reconstruction unit according to the present disclosure.

Referring now to FIG. 6, an embodiment of a superconducting machine, such as a magnetic resonance imaging (MRI) system 10 according to the present disclosure is illustrated. In particular, the imaging system of FIG. 6 includes a scanner 12, scanner control circuitry 14, and system control circuitry 16.

The imaging system 10 additionally includes remote access and storage systems 18 and/or devices such as picture archiving and communication systems (PACS), or other devices such as teleradiology equipment so that data acquired by the imaging system 10 may be accessed on- or off-site. In this way, MRI data may be acquired, followed by on- or off-site processing and evaluation. While the imaging system 10 may include any suitable scanner or detector, in the illustrated embodiment, the imaging system 10 includes a full body scanner 12 having a housing 20 through which an opening (e.g., an annular opening) is formed to accommodate a bore tube 22. The bore tube 22 may be made of any suitable material such as a non-metallic and/or non-magnetic material. A table 24 is moveable into the bore tube 22 to permit a patient 26 to be positioned therein for imaging selected anatomy within the patient. In some embodiments, the bore tube 22 may surround an entire subject or just a portion thereof (e.g., a patient's head, thorax, or extremity). In some embodiments, the bore tube 22 may support the table 24 and/or articulation components (e.g., a motor, pulley, and/or slides).

The scanner 12 may include a series of associated conductive coils for producing controlled electromagnetic fields for exciting the gyromagnetic material within the anatomy of the subject being imaged. Specifically, primary magnet coils 28 are provided for generating a primary magnetic field, which is generally aligned with the bore tube 22. The primary magnetic coils 28 and shielding coils 32 may be made of a superconductor, which during operation, may generate the primary magnetic field to strengths greater than 1 Tesla. To maintain temperatures for the superconducting properties of the coils 28, 32 to function properly, in some embodiments, a thermal shield 34 and a vacuum vessel 36 encloses the coils 28, 32. The vacuum vessel 36 may enclose the thermal shield 34 to reduce convective heat into the coils 28, 32 and other structures in the housing 20 that need to be maintained at cryogenic temperatures. The thermal shield 34 (e.g., radiation shield) maintains a cryogenic temperature (e.g., 40-60 K) and serves to reduce radiation heat load to the coils 28, 32 and other structures in the housing 20 that require cryogenic temperatures for operation. Also, in some MR magnets, such as a helium-bath-cooled magnet, a cryogen (e.g., helium) vessel 30 may help the coils maintain a low temperature (e.g., 4.2 K). In other embodiments of MRI magnets, such as in a conduction-cooled or thermosiphon-cooled magnet, a helium vessel 30 may not be necessary to maintain a cryogenic temperature.

A series of gradient coils 38 collectively permit controlled magnetic gradient fields to be generated for positional encoding of certain of the gyromagnetic nuclei within the patient 26 during examination sequences. Additionally, an RF coil may generate radio frequency pulses for exciting the certain gyromagnetic nuclei within the patient 26. In addition to the coils that may be local to the scanner 12, the imaging system 10 may also include a set of receiving coils 42 (e.g., an array of coils) to be placed proximal to (e.g., against) the patient 26. As an example, the receiving coils 42 can include cervical/thoracic/lumbar (CTL) coils, head coils, single-sided spine coils, and so forth. Generally, the receiving coils 42 are placed close to or on top of the patient 26 so as to receive the weak RF signals (e.g., weak relative to the transmitted pulses generated by the scanner coils) that are generated by certain of the gyromagnetic nuclei within the patient 26 as they return to their relaxed state. In some embodiments, the RF coils 40 may both transmit and receive RF signals accomplishing the role of the receiving coils 42. In other embodiments, the receiving coils 42 may be able to transmit RF signals to RF coils 40.

The various coils of the imaging system 10 may be situated within the housing 20 of the scanner 12, and are controlled by external circuitry to generate the desired field and pulses, and to read emissions from the gyromagnetic material in a controlled manner. In the illustrated embodiment, a main power supply 44 provides power to the primary magnetic coils 28 to generate the primary magnetic field. A driver circuit 50 may include amplification and control circuitry for supplying current to the coils as defined by digitized pulse sequences output by the scanner control circuitry 14.

An RF control circuit 52 is provided for regulating operation of the RF coil 40. The RF control circuit 52 includes a switching device for alternating between the active and inactive modes of operation, wherein the RF coil 40 transmits and does not transmit signals, respectively. The RF control circuit 52 may also include amplification circuitry to generate the RF pulses. Similarly, the receiving coils 42, or RF coils 40 if no separate receiving coils 42 are implemented, are connected to a switch 54, which is capable of switching the receiving coils 42 between receiving and non-receiving modes. Thus, the receiving coils 42 may resonate with the RF signals produced by relaxing gyromagnetic nuclei from within the patient 26 while in the receiving mode, and avoid resonating with RF signals while in the non-receiving mode. Additionally, a receiving circuit 56 may receive the data detected by the receiving coils 42 and may include one or more multiplexing and/or amplification circuits.

It should be noted that while the scanner 12 and the control/amplification circuitry described above are illustrated as being connected by single lines, one or more cables or connectors may be used depending on implementation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner 12 and the scanner control circuitry 14 and/or system control circuitry 16.

As illustrated, the scanner control circuitry 14 includes an interface component circuit 58, which outputs signals for driving the gradient field coils 38 and the RF coil 40 and for receiving the data representative of the magnetic resonance signals produced in examination sequences. The interface component circuit 58 may be connected to a control and analysis circuit 60. The control and analysis circuit 60 executes the commands to the driver circuit 50 and the RF control circuit 52 based on defined protocols selected via system control circuitry 16.

The control and analysis circuit 60 may also serve to receive the magnetic resonance signals and perform subsequent processing before transmitting the data to system control circuitry 16. Scanner control circuitry 14 may also include one or more memory circuits 62, which store configuration parameters, pulse sequence descriptions, examination results, and so forth, during operation.

An interface component circuit 64 may connect the control and analysis circuit 60 to a system control circuit 66 for exchanging data between scanner control circuitry 14 and system control circuitry 16. The system control circuitry 16 may include a third interface component circuit 68, which receives data from the scanner control circuitry 14 and transmits data and commands back to the scanner control circuitry 14. As with the control and analysis circuit 60, the system control circuit 66 may include a computer processing unit (CPU) in a multi-purpose or application specific computer or workstation. System control circuit 66 may include or be connected to a second memory circuit 70 to store programming code for operation of the imaging system 10 and to store the processed coil data for later reconstruction, display and transmission. The programming code may execute one or more algorithms that, when executed by a processor, are configured to perform reconstruction of acquired data.

An additional input output (I/O) interface component 72 may be provided for exchanging coil data, configuration parameters, and so forth with external system components such as remote access and storage systems 18. Finally, the system control circuit 66 may be communicatively coupled to various peripheral devices for facilitating an operator interface component and for producing hard copies of the reconstructed images. In the illustrated embodiment, these peripherals include a printer 74, a monitor 76, and a user interface component 78 including, for example, devices such as a keyboard, a mouse, a touchscreen (e.g., integrated with the monitor 76), and so forth.

In some embodiments, a reconstruction module 80 may be implemented to reconstruct coil data into a viewable image. Furthermore, the reconstruction module may be implemented as software to be executed by one or more processors of a computer system. Additionally or alternatively, the reconstruction module may include a computer, including memory and one or more processors, on which software modules may be run. Reconstructed images may be sent, for example, to a storage system 18 and/or to the monitor 76 for viewing.

Referring now to FIG. 7, a cross-sectional view of an embodiment of an MRI magnet structure of the imaging system 10 of FIG. 6 according to the present disclosure is illustrated. In particular, as shown, the MRI magnet structure 100 may include at least one superconducting coil 102 supported by a support frame 104 and a coil support structure 106.

In addition, the magnet structure 100 may include a plurality of superconducting coils 102, with each coil 102 having a certain width (e.g., W1, W2, and so on) and height (e.g., H1, H2, H3 and so on). Thus, when multiple superconducting coils 102 are employed, the width and height may vary between the individual superconducting coils 102 so as to generate a magnetic field with a specific orientation that is particularly useful when conducting an MRI scan.

The superconducting coil(s) 102 described herein may have superconducting properties at low temperature, magnetic field, and/or current density. Accordingly, the superconducting coils 102 may be operated within one or more low temperature zones appropriate for the selected superconductor. The operating temperature needs to be lower than the critical temperature of superconducting wires. For example, in an embodiment, the operating temperature of the superconducting coils may be equal to or less than to 77 Kelvin (K). As used here, 77 K generally refers to a reference point related to nitrogen transition from gaseous to liquid state at atmospheric pressure. In another embodiment, the operating temperature may be close to 20 Kelvin which is the boiling temperature of liquid hydrogen at atmospheric pressure. In another embodiment, the operating temperature may be close to 4.2 Kelvin, which is the boiling temperature of liquid helium at atmospheric pressure. To this end, the superconducting coils 102 may be composed of any number of materials. For example, the superconducting coils 102 may be constructed of a low-temperature superconducting material, such as niobium-titanium (NbTi), niobium-tin (Nb3Sn), or magnesium-diboride (MgB2), or a high-temperature superconducting material, such as yttrium barium copper oxide (YBCO) or a rare-earth barium copper oxide (ReBCO).

Still referring to FIG. 7, the support frame 104 may provide support for the superconducting coils 102. As such, the superconducting coils may be attached or otherwise secured and held in position by the support frame 104 for use during an MRI scan. The support frame 104 may be capable of moving within the MRI machine 10 or may be stationary as needed for use in an MRI scan. The support frame 104 may be composed of a variety of materials which may be useful for providing support to the superconducting coils while also not interfering with their function of conducting electricity sufficient to provide a magnetic field.

Moreover, as shown, the coil support structure 106 may further include at least one composite component 106, 108. For example, as shown, the coil support structure 106, 108 may include a first composite component 108 and a second composite component 110, with an interface component 112 arranged therebetween. Thus, in certain embodiments, the coil support structure 106 may be formed by attaching the first composite component 108, the interface component 112, and the second composite component 110 to each other in a stacked configuration in a lateral direction 116. To minimize the frictional energy release at the interface component 112 and reduce the potential risk of quench of the superconducting coils 102, the coefficient of friction of the interface component 112 needs to be minimized. It should be understood that the coil support structure 106 assists with preventing the superconducting coils 102 from contacting each other, so as to avoid heat generated by the frictional contact. Such prevention causes the superconducting machine to be less efficient and/or overheat and quench, which may cause damage to the superconducting coils 102.

Still referring to FIG. 7, the coil support structure 106 may also have a height H2. It should be noted that the height H2 of the coil support structure 106 may differ from the height H1 of the superconducting coil(s) 102. Thus, as shown, a gap 114 may be formed between the support frame 104 and the coil support structure 106 so as to separate the coil support structure 106 from the support frame 104. As such, in certain embodiments, the gap 114 is configured to allow relative sliding between the first composite component 108 and the second composite component 110 (as is discussed herein below) without coming into contact with the support frame 104 so as to prevent frictional heat from generating as a result. The gap 114 may have a height H3 that ranges from about 2 millimeters (mm) to about 10 centimeters (cm), such as about 5 mm to about 9 cm, such as about 10 mm to about 8 cm, such as about 25 mm to about 7 cm, such as about 50 mm to about 6 cm, such as about 75 mm to about 5 cm, such as about 1 cm to about 4 cm, such as about 2 cm to about 3 cm.

In further embodiments, the first composite component 108, the second composite component 110, and the interface component 112 may be attached to each other using a variety of materials. For example, the first composite component 108, the second composite component 110, and the interface component 112 may be attached to each other with an adhesive material such as an epoxy or a resin.

Furthermore, the first composite component 108 and the second composite component 110 may also be constructed of materials which are useful in a superconducting machine. For example, the first and second composite components 108, 110 may be constructed of a fiber material, a polymer material like Teflon or Mylar, an epoxy, or combinations thereof. In particular, the first and second composite components 108, 110 may be constructed of a fiber-reinforced polymer (FRP) material or a copper material. The benefit of the aforementioned materials, in particular, is that such materials may be capable of preventing heat transfer from the first composite component 108 and the second composite component 110 to the superconducting coils and as a result reduce the possibility of quench in the superconducting coils.

The interface component 112 is provided as a buffer between the first composite component 108 and the second composite component 110. Accordingly, in such embodiments, the interface component 112 may be a frictionless sliding interface component. For example, the interface component 112 is capable of sliding between the first and second composite components 108, 110 to reduce the likelihood of frictional energy release being generated therebetween. To this end, the interface component 112 may be composed of materials such as a reinforced fiber material, a polymer material like Teflon or Mylar, an epoxy, or combinations of multilayer material instead of single layer material.

In particular, the interface component 112 may be constructed of a high-pressure fiberglass laminate, such as a G10 or G11 spacer. Such materials may also provide insulation to help reduce the risk of heat being transferred through the interface component 112 and to the first and second composite components 108, 110 and/or the superconducting coil 102. These materials may also be capable of preventing the change of the coefficient of friction due to high contact pressure and abrasions on those interfaces during the normal operation of MRIs or superconducting generators.

Various aspects and embodiments of the present disclosure are defined by the following numbered clauses:

Clause 1. A superconducting machine, comprising:
at least one superconducting coil;
a coil support structure arranged with the at least one superconducting coil, the coil support structure comprising:
at least one composite component affixed to the at least one superconducting coil; and
an interface component in frictional contact with the at least one composite component so as to reduce a likelihood of quench of the at least one superconducting coil.

Clause 2. The superconducting machine of clause 1, wherein the at least one superconducting coil and the coil support structure are supported by a support frame, the support frame defining a base and at least one support plate for supporting the at least one superconducting coil and the coil support structure.

Clause 3. The superconducting machine of clause 2, wherein the support frame comprises one or more grooves formed therein for relieving stress.

Clause 4. The superconducting machine of clauses 2-3, wherein the at least one composite component comprises, at least, a first composite component and second composite component, the first composite component being affixed between a first side of the at least one superconducting coil and the interface component atop the support plate, the second composite component being affixed between a second side of the at least one superconducting coil and the base.

Clause 5. The superconducting machine of clauses 2-4, wherein the at least one superconducting coil and the coil support structure are separated from an interior portion of the support frame by a gap.

Clause 6. The superconducting machine of clause 4, wherein the first composite component and the second composite component are constructed of an adhesive material.

Clause 7. The superconducting machine of any of the preceding clauses, wherein the interface component is constructed of a high-pressure fiberglass laminate.

Clause 8. The superconducting machine of clause 2-7, wherein the at least one superconducting coil comprises at least one rib on an outer surface thereof for reducing temperature rise from the frictional contact between the interface component and the at least one composite component.

Clause 9. The superconducting machine of any of the preceding clauses, wherein the superconducting machine is a wind turbine generator.

Clause 10. A superconducting machine, comprising:
a plurality of superconducting coils, the plurality of superconducting coils comprising at least a first superconducting coil and a second superconducting coil;
a coil support structure arranged between the first and second superconducting coils, the coil support structure comprising:
at least one composite component affixed to one of the first superconducting coil or the second superconducting coil; and
a sliding interface component arranged adjacent to the at least one composite component so as to reduce a likelihood of quench of the plurality of superconducting coils.

Clause 11. The superconducting machine of clause 10, wherein the at least one composite component comprises, at least, a first composite component and second composite component.

Clause 12. The superconducting machine of clause 11, wherein the first composite component is affixed to the first superconducting coil via an adhesive material and the composite component is affixed to the second superconducting coil via the adhesive material.

Clause 13. The superconducting machine of clauses 11-12, wherein the sliding interface component is arranged between the first and second composite components in a stacked configuration.

Clause 14. The superconducting machine of clauses 11-13, wherein the sliding interface is frictionless.

Clause 15. The superconducting machine of clauses 11-14, wherein the plurality of superconducting coils and the coil support structure are supported by a support frame.

Clause 16. The superconducting machine of clause 15, wherein the plurality of superconducting coils are secured to the support frame and the coil support structure is separated from the support frame by a gap.

Clause 17. The superconducting machine of clauses 11-16, wherein the first composite component is constructed of at least one of a fiber-reinforced polymer (FRP) material or a copper material.

Clause 18. The superconducting machine of clauses 11-17, wherein the second composite component is constructed of a fiber-reinforced polymer (FRP) material.

Clause 19. The superconducting machine of clauses 10-18, wherein the interface component is constructed of a high-pressure fiberglass laminate.

Clause 20. The superconducting machine of clauses 10-19, wherein the superconducting machine is a magnetic resonance imaging (MRI) machine.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A superconducting machine, comprising:
   at least one superconducting coil;
   a coil support structure arranged with the at least one superconducting coil, the coil support structure comprising:
   at least one composite component affixed to the at least one superconducting coil; and
   an interface component in frictional contact with the at least one composite component so as to reduce a likelihood of quench of the at least one superconducting coil,
   wherein the at least one superconducting coil has at least one side exposed to a physical gap.

2. The superconducting machine of claim 1, wherein the at least one superconducting coil and the coil support structure are supported by a support frame, the support frame defining a base and at least one support plate for supporting the at least one superconducting coil and the coil support structure.

3. The superconducting machine of claim 2, wherein the support frame comprises one or more grooves formed therein for relieving stress.

4. The superconducting machine of claim 2, wherein the at least one composite component comprises, at least, a first composite component and second composite component, the first composite component being affixed between a first side of the at least one superconducting coil and the interface component atop the support plate, the second composite component being affixed between a second side of the at least one superconducting coil and the base.

5. The superconducting machine of claim 2, wherein the at least one superconducting coil and the coil support structure are separated from an interior portion of the support frame by the physical gap.

6. The superconducting machine of claim 4, wherein the first composite component and the second composite component are constructed of an adhesive material.

7. The superconducting machine of claim 1, wherein the interface component is constructed of a high-pressure fiberglass laminate.

8. The superconducting machine of claim 2, wherein the at least one superconducting coil comprises at least one rib on an outer surface thereof for reducing temperature rise from the frictional contact between the interface component and the at least one composite component.

9. The superconducting machine of claim 1, wherein the superconducting machine is a wind turbine generator.

10. A superconducting machine, comprising:
    a plurality of superconducting coils, the plurality of superconducting coils comprising at least a first superconducting coil and a second superconducting coil;
    a coil support structure arranged between the first and second superconducting coils, the coil support structure comprising:
    at least one composite component affixed to one of the first superconducting coil or the second superconducting coil; and
    a sliding interface component arranged adjacent to the at least one composite component so as to reduce a likelihood of quench of the plurality of superconducting coils, wherein the first and second superconducting coils have at least one side exposed to a physical gap.

11. The superconducting machine of claim 10, wherein the at least one composite component comprises, at least, a first composite component and second composite component.

12. The superconducting machine of claim 11, wherein the first composite component is affixed to the first superconducting coil via an adhesive material and the composite component is affixed to the second superconducting coil via the adhesive material.

13. The superconducting machine of claim 11, wherein the sliding interface component is arranged between the first and second composite components in a stacked configuration.

14. The superconducting machine of claim 11, wherein the sliding interface is frictionless.

15. The superconducting machine of claim 11, wherein the plurality of superconducting coils and the coil support structure are supported by a support frame.

16. The superconducting machine of claim 15, wherein the plurality of superconducting coils are secured to the support frame and the coil support structure is separated from the support frame by the physical gap.

17. The superconducting machine of claim 11, wherein the first composite component is constructed of at least one of a fiber-reinforced polymer (FRP) material or a copper material.

18. The superconducting machine of claim 11, wherein the second composite component is constructed of a fiber-reinforced polymer (FRP) material.

19. The superconducting machine of claim 10, wherein the interface component is constructed of a high-pressure fiberglass laminate.

20. The superconducting machine of claim 10, wherein the superconducting machine is a magnetic resonance imaging (MRI) machine.

* * * * *